(12) United States Patent
Lindblom et al.

(10) Patent No.: US 9,999,151 B2
(45) Date of Patent: Jun. 12, 2018

(54) SUPPORT STRUCTURE FOR POWER ELECTRONICS

(71) Applicant: ABB Technology AG, Zurich (CH)

(72) Inventors: Marcus Lindblom, Schinznach-Bad (CH); Michael Weiss, Winterthur (SE)

(73) Assignee: ABB Schweiz AG, Baden (CH)

( * ) Notice: Subject to any disclaimer, the term of this patent is extended or adjusted under 35 U.S.C. 154(b) by 0 days. days.

(21) Appl. No.: 15/088,807

(22) Filed: Apr. 1, 2016

(65) Prior Publication Data

US 2016/0219743 A1  Jul. 28, 2016

Related U.S. Application Data

(63) Continuation of application No. PCT/EP2014/071294, filed on Oct. 6, 2014.

(51) Int. Cl.
*H05K 7/20* (2006.01)
*H05K 7/14* (2006.01)
*H05K 9/00* (2006.01)

(52) U.S. Cl.
CPC ............. *H05K 7/14* (2013.01); *H05K 7/1432* (2013.01); *H05K 7/20927* (2013.01); *H05K 9/0062* (2013.01)

(58) Field of Classification Search
None
See application file for complete search history.

(56) References Cited

U.S. PATENT DOCUMENTS

| | | | |
|---|---|---|---|
| 5,353,216 A | 10/1994 | Ayers et al. | |
| 5,548,085 A | 8/1996 | Flores | |
| 5,808,866 A | 9/1998 | Porter | |
| 6,095,361 A | 8/2000 | Huang | |
| 9,336,939 B2 * | 5/2016 | Steiger | H01F 27/002 |
| 2008/0123288 A1 * | 5/2008 | Hillis | H05K 7/20745 361/679.34 |
| 2009/0080147 A1 * | 3/2009 | Kunkle | H05K 7/1457 361/622 |
| 2009/0242552 A1 * | 10/2009 | Myers | B65D 88/121 220/4.33 |
| 2010/0301672 A1 * | 12/2010 | Di Cristofaro | H02B 1/52 307/39 |
| 2011/0133754 A1 * | 6/2011 | Werle | G01R 31/1227 324/555 |

(Continued)

FOREIGN PATENT DOCUMENTS

| DE | 7500696 U | 11/1976 |
|---|---|---|
| DE | 3931570 C1 | 3/1991 |

(Continued)

OTHER PUBLICATIONS

International Search Report and Written Opinion, PCT/EP14/71294, dated Feb. 19, 2015, 11 pages.

*Primary Examiner* — Courtney Smith
(74) *Attorney, Agent, or Firm* — Taft Stettinius & Hollister LLP; J. Bruce Schelkopf

(57) ABSTRACT

The application concerns a support structure for power electronics, comprising a holder for the insertion of at least one power electronics module and an electrically conductive external geometry which surrounds the holder and has rounded corners and edges with a radius of curvature which is greater than a predetermined minimum radius.

14 Claims, 6 Drawing Sheets

(56) References Cited

U.S. PATENT DOCUMENTS

2013/0083476 A1* 4/2013 Clidaras .................. G06F 1/20
361/679.41

FOREIGN PATENT DOCUMENTS

| DE | 19856776 A1 | 6/2000 |
|---|---|---|
| DE | 102009007956 A1 | 8/2010 |
| DE | 102006057796 B4 | 3/2011 |
| DE | 202011005290 U1 | 6/2011 |
| EP | 0389910 A1 | 10/1990 |
| EP | 0992424 A2 | 4/2000 |
| EP | 1178593 A1 | 2/2002 |
| EP | 1329145 B1 | 8/2005 |
| WO | 2004082348 A2 | 9/2004 |

* cited by examiner

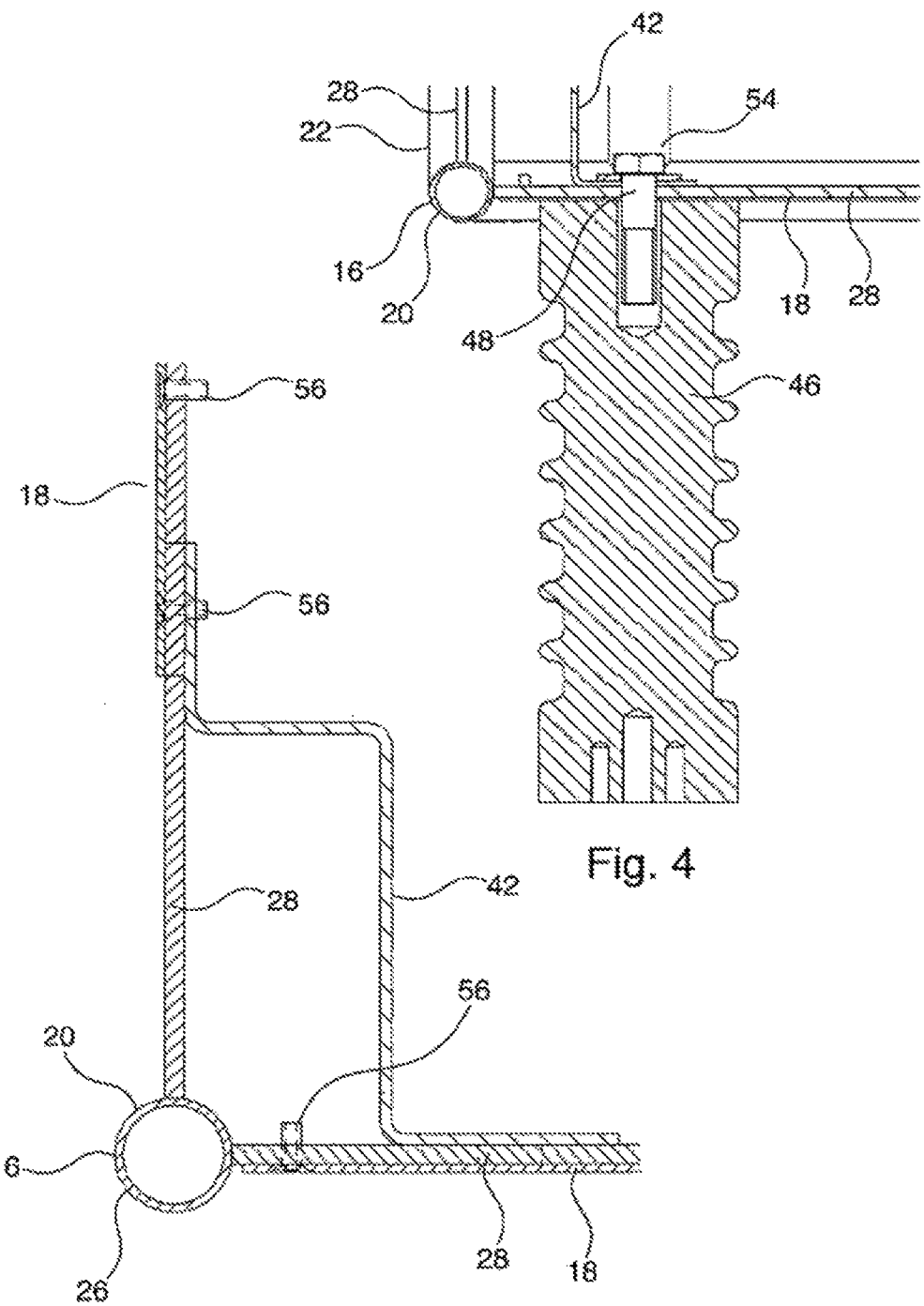

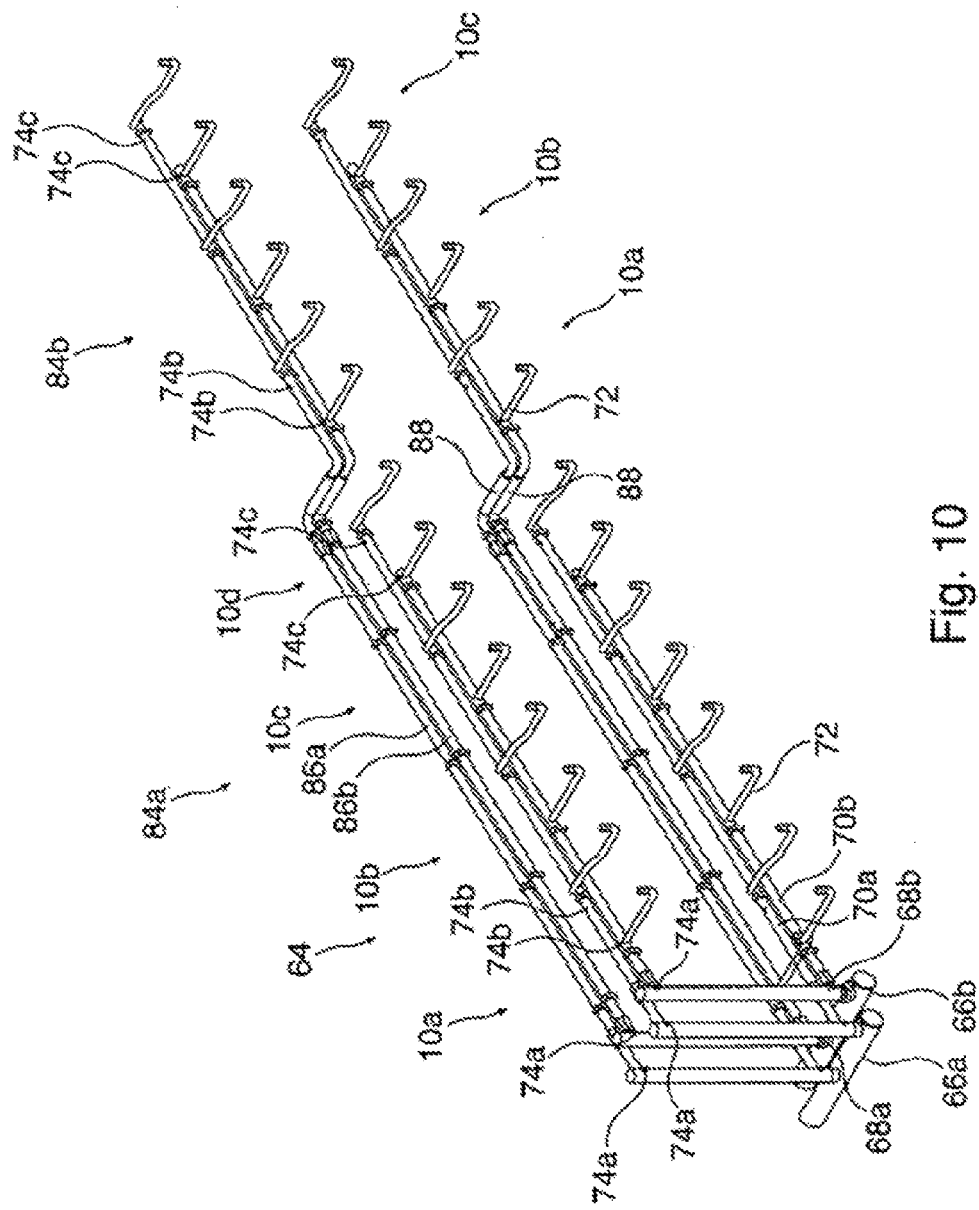

SUPPORT STRUCTURE FOR POWER ELECTRONICS

FIELD OF THE INVENTION

The invention relates to a mechanical support structure for power electronics, and to a support structure arrangement which comprises a plurality of these support structures.

BACKGROUND TO THE INVENTION

When power electronics modules or PEBBs (Power Electronics Building Blocks) are integrated into systems, such as converters for example, they are usually screwed to supports in a metal cabinet as a support structure and manually connected to power lines, a cooling system and signal lines. In the majority of converters, a power electronics module comprises a connection point at which said power electronics module is connected to ground potential, either directly or by means of an electrical line.

When a power electronics module is intended to be used in such a way that a connection to ground potential of this kind is not expedient (as is often the case in a multilevel converter for example) and is intended to be provided with a connection to an electrical potential which differs from ground potential, the power electronics module can be equipped with a housing which is composed of insulating material or with field-homogenizing elements which are fitted within the cabinet by means of insulators at a sufficiently large distance from the cabinet and other surrounding components. In this case, the cabinet is normally at ground potential.

In the majority of water-cooled power electronics converters, the main system pipes for coolant are at ground potential and the heat sinks which are at a different electrical potential are connected to the main system pipes by means of insulating pipes (for example rubber or plastic). When the heat sinks are at a different electrical potential, an electric current generally flows through the cooling water.

Some components in the coolant circuit begin to corrode when they are exposed to this electrolysis current for a relatively long time. In certain empirical studies, safety levels have been defined for different metal materials, the corrosion rate at said safety levels being low enough in order to ensure that no problems can occur during the service life of the product. Typical measures for reducing the electrolysis currents and achieving these safety levels comprise deionized water and adapting the geometry of the insulating pipes.

Deionized water, which is optionally mixed with glycol in order to prevent freezing, has a very low level of conductivity. The conductivity of the water can also be monitored, and the conductivity can be kept low by continuous removal of ions from the liquid.

Furthermore, the length of the insulating pipes can be increased and/or the diameter of said insulating pipes can be reduced in order to increase the resistance in these sections of the water circuit and therefore to lower the electrolysis currents to the corresponding safety level.

However, in some cases, it is not expedient or possible to correspondingly change the geometry of the insulating pipes. For example, at certain voltage levels, it would be necessary to increase the pipe lengths in such a way that the pressure would drop too much. In addition, the available installation space can limit the length of the pipes.

SUMMARY OF THE INVENTION

The object of the invention is to electrically insulate power electronics modules from their surrounding area in a simple manner.

This object is achieved by the subject matter of the independent claims. Further embodiments of the invention can be gathered from the dependent claims and from the following description.

One aspect of the invention relates to a support structure for power electronics. In this case, power electronics can be understood to mean electronic components (for example semiconductors, capacitors, resistors, coils etc.) which are designed to process voltages of over 1000 V and/or currents of over 10 A.

According to one embodiment of the invention, the support structure comprises a holder for the insertion of at least one power electronics module, and an electrically conductive outer geometry which surrounds the holder and has rounded corners and edges with a radius of curvature which is greater than a prespecified minimum radius.

In order to increase the inception voltage for partial discharges and flashovers, no sharp edges and corners project outward, in particular at points which are opposite further components at a different electrical potential. The minimum radius of all corners and edges can be selected so as to correspond to a desired system voltage of the electronics module.

The power electronics module or modules can be mechanically fixed to the support structure and the power electronics module or modules can be insulated with respect to partial discharges and flashovers. Furthermore, the support structure can provide an interface to a coolant line and/or to signal cables.

The support structure is at least partially designed from electrically conductive material and has an outer geometry which homogenizes the electrical field strength on the outside of the support structure. Therefore, the support structure or the outer geometry of said support structure constitutes an electrical shield for the power electronics modules which are contained in the interior of said support structure.

The support structure and power electronics modules which are accommodated in the support structure can together form a mechanically stable assembly from which relatively large modular power electronics devices, such as converters for example, can be constructed.

The support structure does not have to fully surround the power electronics modules and optionally additional electronics components which are contained or accommodated in said support structure. Said support structure can have openings through which, for example, module inserts for power electronics modules can be inserted into the support structure. The support structure can also be considered to be a housing, shelf or rack for the contained components.

According to one embodiment of the invention, the outer geometry of the support structure is cuboidal. For example, the support structure can have a stackable box or a stackable housing. The outer geometry can be designed such that a plurality of support structures can be stacked next to one another and/or one above the other.

According to one embodiment of the invention, the support structure further comprises a support frame comprising pipes which are connected to one another, in particular which are composed of electrically conductive material such as metal for example, and which form the corners and edges of the support structure. The pipes can be metal pipes for example. The pipes can have a circular cross section with, in particular, a radius which is greater than the abovementioned minimum radius. However, other cross sectional shapes are also possible.

These pipes, for example pipes of standard sizes, can be used as the main structure. The external dimensions of the support structure can be easily adjusted by extending and shortening the pipes. The minimum radius of the corners and edges can be defined by selecting a specific pipe diameter. In this way, a support structure with rounded corners and edges and in which power electronics modules are shielded can be created in a simple manner.

According to one embodiment of the invention, the support frame comprises two rectangular pipe rings with rounded corners, which pipe rings are arranged parallel in relation to one another and are connected by means of pipes which run orthogonally in relation to the pipe rings. The pipes can be connected to form a cuboidal support frame.

According to one embodiment of the invention, the support structure further comprises at least one side panel which, in particular, is composed of electrically conductive material, such as metal for example, and provides a flat outer surface of the outer geometry.

The side panel can be a metal sheet or a sheet-metal panel. The side panel can be fastened between the pipes of the support frame. It should be understood that, in the case of a cuboidal outer geometry, the side panel or else a plurality of side panels can be fastened to a top face, lower face, front face, rear face etc.

The side panel(s) provides/provide an electrical shield for the side surfaces of the support structure. The rigidity of the support structure can be increased by way of the side panels. Furthermore, openings for controlled air flow through the support structure can be provided in the side panel.

The side panel can have a rectangular basic shape with rounded corners, wherein the rounded corners have a radius which is greater than the minimum radius.

Elements (such as reinforcements and/or rails for example) of any desired geometric shape can be used as further supporting elements within the pipes of the support frame and the side panels, that is to say within the outer geometry.

According to one embodiment of the invention, the at least one side panel is provided between pipes of a support frame of the support structure. The side panel can be accommodated in a side surface of the support frame.

According to one embodiment of the invention, at least two power electronics modules can be inserted into the holder in the support structure one behind the other. By way of example, two power electronics modules together can form a converter cell for a modular converter by way of the support structure. A first power electronics module can comprise a capacitor bank for a cell capacitor. A second power electronics module can comprise a half-bridge circuit or full-bridge circuit which is connected to the capacitor bank and can charge and discharge said capacitor bank in the event of corresponding actuation.

According to one embodiment of the invention, the support structure further comprises at least two sliding rails which are arranged in the holder and on which at least one power electronics module can be inserted into the holder. One or more power electronics modules can be guided and oriented by way of the sliding rails when the power electronics module or modules is/are inserted into the support structure. The sliding rails can fix the power electronics module or modules in the support structure. Furthermore, the sliding rails can increase the mechanical strength and/or rigidity of the support structure.

According to one embodiment of the invention, the support structure further comprises a plurality of insulators which are fitted to the outer geometry. The support structure can be fastened to a surrounding structure or to a further support structure by means of said insulators. The insulators can be fastened, for example, to the top face and/or to the bottom face. However, it is also possible to fasten the insulators to the sides of the support structure.

A further aspect of the invention relates to a support structure arrangement for a modular converter. In this case, a modular converter can be a modular multilevel converter with a plurality of converter cells which are connected in series and which can each have a half-bridge circuit or full-bridge circuit with a cell capacitor connected to it.

According to one embodiment of the invention, the support structure arrangement comprises a plurality of support structures, as are described above and below for example. In this case, the support structures can be arranged in a (for example vertical or horizontal) row. Insulators can be arranged between the support structures, the support structures being connected to one another by means of said insulators. In this way, the support structures can all be at their own electrical potential.

According to one embodiment of the invention, the support structures are arranged in a plurality of rows which are stacked one on the other. By way of example, in each case two support structures can be stacked one on the other. It is also possible here for insulators to be arranged between the two support structures.

According to one embodiment of the invention, the support structure arrangement further comprises a coolant pipe, which is composed of insulating material, for providing cooling liquid for power electronics modules in the support structures. The coolant pipe can be guided along the row within the outer geometries of the support structures, for example through a base of the support structures. All of the coolant pipes can be produced from insulating material, such as plastic, rubber, polypropylene etc. for example.

Many or all of the components of the cooling circuit can be arranged within the electrical shield which is provided by the support structures in order to restrict the electrical fields in the area surrounding the components and to reduce external influences on the water and dielectric solid bodies of the cooling circuit.

The coolant can be, for example, cooling water. Water-cooled components are cooled, for example, either directly by water flowing through them (as may be the case in resistors and capacitors for example) or they are connected to a heat sink (for example in resistors and semiconductors).

In general, the support structure arrangement will have a coolant supply pipe and a coolant discharge pipe which run parallel and are guided along the row within the outer geometries of the support structures.

According to one embodiment of the invention, the coolant pipe or pipes (supply and/or discharge) are guided beneath rails in the support structures. Therefore, a power electronics module can be pushed away by means of the coolant pipe.

According to one embodiment of the invention, the support structure arrangement further comprises at least one electrode, which is arranged in the coolant pipe, within the outer geometry of a support structure which is electrically conductively connected to the support structure and/or to a power electronics module in the support structure in such a way that the electrode is at the potential of the support structure and/or of the power electronics module.

Instead of attempting to limit electrolysis currents through the coolant, electrodes can be used which are composed of a substantially corrosion-resistant material (such as platinum for example) and are inserted into the water circuit at specific points and are changed to the potential of a power electronics module. The electrolysis current flows only through the electrodes which are set to a desired potential.

During operation of the converter, the electrode can therefore be at the potential of the associated power electronics module. If a coolant supply pipe and a coolant discharge pipe are present, a respective electrode can be arranged in the supply pipe and in the discharge pipe within the outer geometry of the support structure.

According to one embodiment of the invention, the electrode is arranged in a first support structure in the row of support structures, and a further electrode is arranged in the last support structure of this row. Therefore, at least the component of the electrolysis current, which is caused by the different potential of the power electronics modules which are connected to the coolant pipe, can be limited to the row of support structures.

Particularly in the case of a modular multilevel converter, the nominal voltage of said multilevel converter can vary with the system power. If cooled components and heat sinks are set to a potential relative to the ground potential, the potentials of the power electronics modules can be greater than in standard systems by a factor of 10.

According to one embodiment of the invention, the support structure arrangement further comprises a connecting pipe, which is composed of an insulating material, for connecting the coolant pipe to a main system pipe, and an electrode which is arranged in the connecting pipe and is electrically connected to a ground potential of the converter.

In the case of a supply pipe and a discharge pipe, the two pipes can each be connected to the respective pipe of the main system by means of a supply connecting pipe and a discharge connecting pipe. In general, the main system pipes are composed of metal, that is to say are of electrically conductive design. With the electrode at ground potential in the connecting pipe, an electrolysis current between the main system pipes and the power electronics modules can be virtually fully suppressed.

According to one embodiment of the invention, the support structure arrangement further comprises a first group of support structures in the row, and a second group of support structures in the row adjoining the first group, and a further coolant pipe for the second group of support structures, which further coolant pipe is guided through the support structures of the first group. The design of the insulating coolant pipes with the inserted electrodes can be scaled with respect to the system voltage without the housing of the converter or other components additionally having to be taken into consideration.

By way of example, an electrode at ground potential can be arranged in the connection of the first group to the main system pipe, an electrode can be arranged in the first support structure of the first group, and an electrode can be arranged in the last support structure of the first group in the corresponding section of the coolant circuit, that is to say in the coolant pipes.

Furthermore, an electrode at ground potential can be arranged in the connection of the second group to the main system pipe, an electrode can be arranged in the first support structure of the second group, and an electrode can be arranged in the last support structure of the second group in the coolant pipes.

BRIEF DESCRIPTION OF THE FIGURES

Exemplary embodiments of the invention will be described in detail below with reference to the appended figures.

FIG. 4 shows a cross section through a detail of the support structure from FIG. 1.

FIG. 5 shows a cross section through a further detail of the support structure from FIG. 1.

FIG. 10 shows a perspective view of a further coolant circuit for a support structure arrangement according to a further embodiment of the invention.

The reference symbols used in the figures and the meaning of said reference symbols are listed in summary in the list of reference symbols. In principle, identical or similar parts are provided with the same reference symbols.

DETAILED DESCRIPTION OF EXEMPLARY EMBODIMENTS

Figure 1:
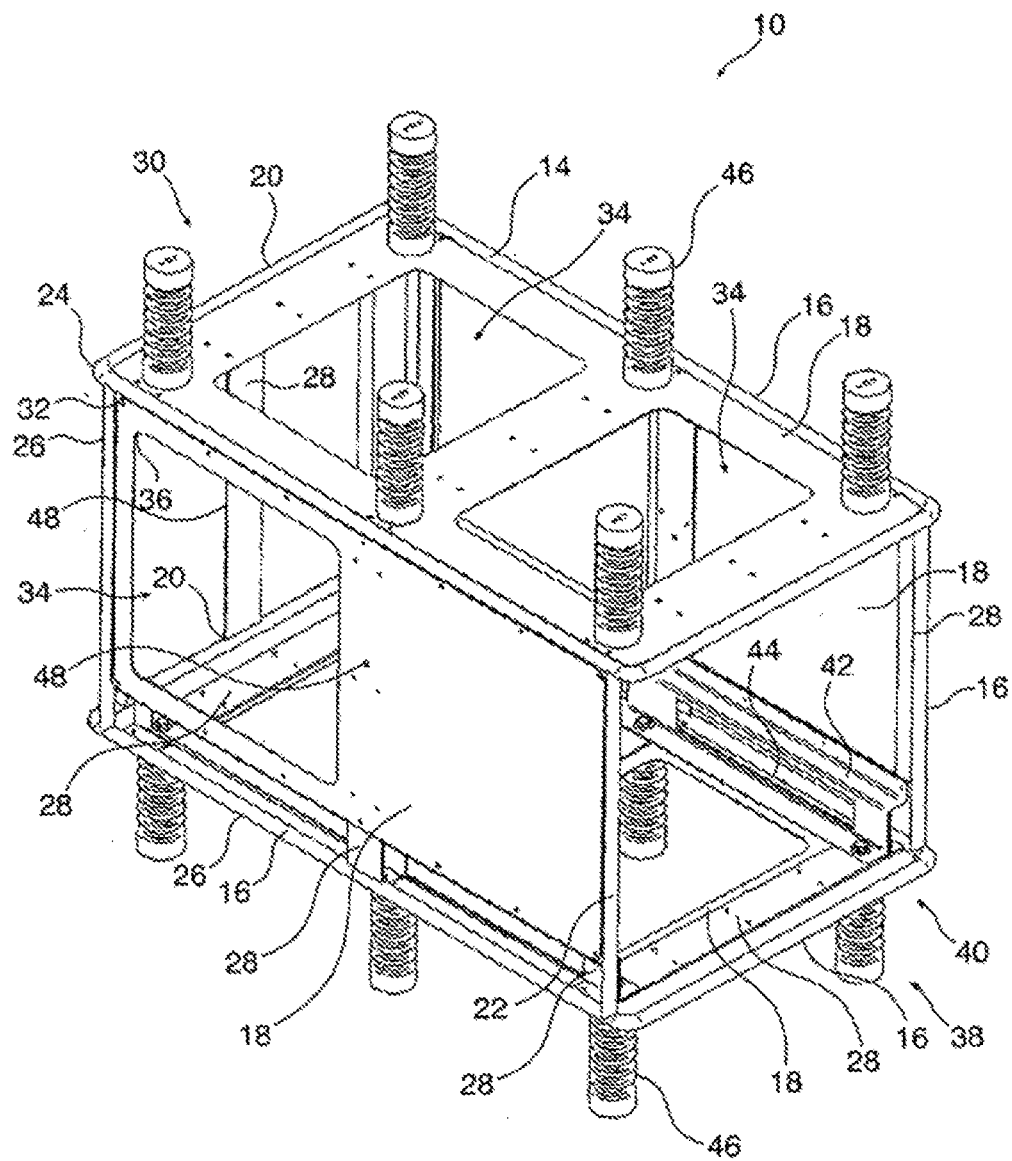
FIG. 1 shows a perspective view of a support structure according to one embodiment of the invention.

FIG. 1 shows a perspective view of a support structure 10 which is made up of a support frame 14 which is composed of metal pipes 16 with side or sheet-metal panels 18 suspended between said metal pipes.

The support frame 14 has a substantially cuboidal outer shape and comprises two rectangular pipe rings 20 which are connected to one another by means of four further pipes 22 which run substantially orthogonally in relation to the planes of the pipe rings 20. The connecting points of the pipes 22 to the pipe rings 20 are arranged in a manner offset in relation to the rounded corners 24 of the pipe rings 20.

The pipes 16, 20, 22 can be plug-connected and/or welded to one another, so that the pipe frame or support frame 14 is produced. All of the rounded corners 24 and edges 26 for the support structure 10 are provided by outer surfaces of the pipes 16, 20, 22.

The support frame 14 can be provided with side panels 18 on one or more sides (including at the top and at the bottom). The side panels 18 are fastened to the pipes 16, 20, 22 by means of further reinforcement elements 28 which are (slightly) inwardly offset in relation to the pipes 16, 20, 22. This produces an outer geometry 30 which has corners 24 and edges 26 which are only rounded toward the outside.

The reinforcement elements 28, which can be welded to the pipes 16, 20, 22, are rectangular metal strips which are arranged within the side panels 18 and/or are inwardly offset in relation to the pipes 16, 20, 22.

The side panels 18 are rectangular with rounded corners 32 and can have one or more openings 34, for example for cooling air. The openings 34 also have rounded corners 36.

The support structure 10 contains a holder 38 with a substantially cuboidal internal volume which is surrounded by the substantially cuboidal outer geometry. One or more power electronics modules can be inserted into the support structure 10 via an opening 40.

The support structure 10 can be set to a high electrical potential with respect to a ground potential or with respect to other support structures 10. A high degree of voltage insulation is achieved by a shield which homogenizes the electrical field strength around the power electronics modules. This shield is provided by the rounded edges 26 and corners 24, 32, 36 of the support structure 10. This outer geometry 30 of the support structure 10 increases the inception voltage for partial discharges and flashovers.

In particular, the edges 26 and corners 24, 32, 36 are designed such that the radii of curvature of all of said corners and edges are greater than a minimum radius which has been defined for the support structure 10.

Sliding rails 42 can be fastened within the support structure 10. The substantially W-shaped sliding rails 42 are fastened to a base of the support structure 10, for example by means of the reinforcement elements 28.

Lateral openings 44 through which, for example, coolant pipes (see further below) can be pushed through the support structure are located beneath the sliding surface in the sliding rails 42. For this reason, the side panels 18 next to the holder 38 on the left-hand side and on the right-hand side also do not run as far as the lower pipes 16, but rather leave free a lower section at the base.

Insulators 46, for example standard insulators, can be fastened to the support structure 10. By way of example, in each case six insulators 46 can be fastened to the upper side panel 18 and the lower side panel 18. Fastening can additionally be performed by means of the reinforcement elements 28.

Fastening points 48 (such as holes for rivets or screws for example) for insulators 46 can be provided on the support structure 10 in the side panels 18, not only in the upper and lower side panel 18, but also in the rear, left-hand-side and right-hand-side side panel 18.

Figure 2:
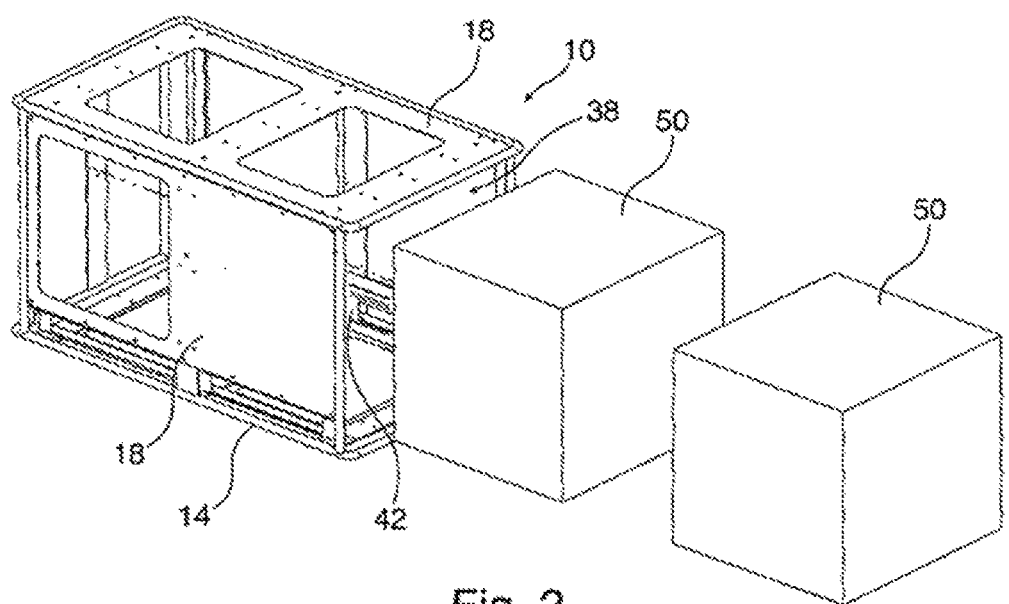
FIG. 2 shows a perspective view of the support structure from FIG. 1 together with two power electronics modules.

FIG. 2 shows the support structure 10 from FIG. 1 together with two power electronics modules 50 (without the insulators 46). The power electronics modules 50 are illustrated merely schematically as cuboids, but can have a significantly more complicated outer shape.

The power electronics modules 50 can be installed in the support structure 10 such that they are inserted into the holder 38 on the rails 42 in succession.

Figure 3:
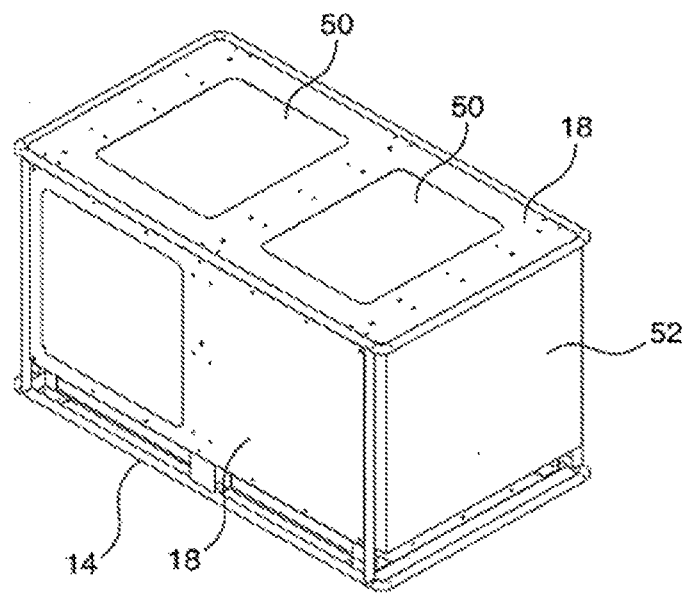
FIG. 3 shows a perspective view of the support structure from FIG. 1 together with two inserted power electronics modules.

FIG. 3 shows the support structure 10 with the two inserted power electronics modules 50. The opening 40 in the holder can then be closed by a covering panel 52 which, just like the side panels 18, can be a sheet-metal panel.

FIG. 4 shows a cross section through the support structure 10 in the region of an insulator 46. The insulator 46 is fastened from the inside of the support structure 10, for example by means of a screw 54. In this case, the opening 48 through which the screw 54 runs runs through a foot of the rail 42, a reinforcement element 28 and a side panel 18.

FIG. 5 shows a cross section through the support structure 10 in the region of a rail 42. Recessed fastening means 56, such as recessed screws or recessed rivets for example, can be used in order to avoid high field strengths at points at which fastening means 56 point outward. By way of example, a side panel 18 with a recessed fastening means 56 can be fastened to a reinforcement element 28 and/or the rail 42 can be fastened to a reinforcement element 28 by way of a recessed fastening means 56.

Figures 6, 7:
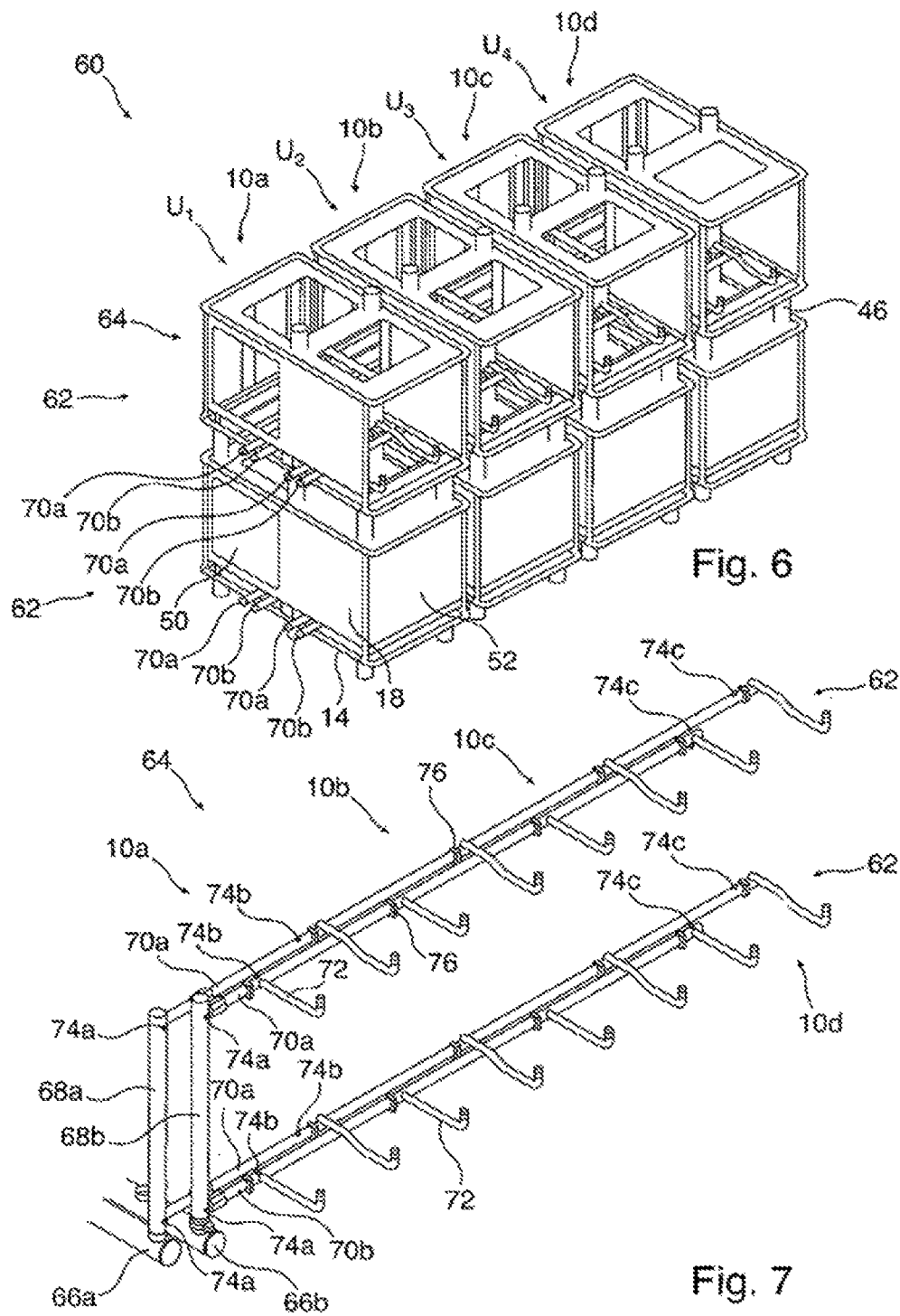
FIG. 6 shows a perspective view of a support structure arrangement according to one embodiment of the invention.
FIG. 7 shows a perspective view of a coolant circuit for the support structure arrangement from FIG. 6.

FIG. 6 shows a support structure arrangement 60 which is constructed from two rows 62 of support structures 10a, 10b, 10c, 10d which are arranged one above the other and are supported on one another by insulators 46. Power electronics modules 50 are illustrated only in the lower row 62, so that pipes of the cooling circuit 64 are visible in the upper row. However, other arrangements, such as vertical rows for example, are also possible.

Together with the power electronics modules 50, the support structure arrangement 60 can comprise the power electronics of a modular multilevel converter, wherein the power electronics modules 50 are connected electrically in series (for example along the row 62). The support structure 10a, 10b, 10c, 10d or the housing of each power electronics module 50 is then at an electrical potential $U_1, U_2, \ldots, U_n$ relative to the ground potential. The electrical potentials of different support structures 10a, 10b, 10c, 10d or power electronics modules 50 can differ. By way of example, the voltage difference between adjacent power electronics modules 50 can have the same order of magnitude.

FIG. 7 shows the coolant circuit 64 for the support structure arrangement 60 from FIG. 6. The entire arrangement 60 is supplied with coolant, such as cooling water for example, via main system pipes 66a, 66b (a main system supply pipe 66a and a main system discharge pipe 66b). The two main system pipes 66a, 66b are generally metal pipes and are at ground potential.

The main system pipes 66a, 66b are connected to coolant pipes 70a, 70b (a coolant supply pipe 70a and a coolant discharge pipe 70b) by means of connecting pipes 68a, 68b (a supply connecting pipe 68a and a discharge connecting pipe 68b). Both the lower row 62 and the upper row 62 each have two or four (see FIG. 6) coolant pipes 70a, 70b. The connecting pipes 68a, 68b and the coolant pipes 70a, 70b are manufactured from an insulating material, such as plastic or rubber for example.

The heat sinks of the individual power electronics modules 50 are connected to the coolant pipes 70a, 70b by means of hoses 72.

As is clear from FIG. 6, the coolant pipes 70a, 70b are guided through the base of the support structures 10 through lateral openings. In this case, said coolant pipes are guided beneath the side panels 18 and above the pipe 16 of the support frame 14 through the opening 44 in the rails 42. The plastic pipes 70a, 70b, 72 to the water supply and water discharge are therefore arranged through the shields of the support structures 10a, 10b, 10c, 10d along the length of the converter.

Since the coolant pipes 70a, 70b and hoses 72 run within the electrical shield which is provided by the support structure 10 of the power electronics modules 50, it is not necessary to take into consideration any insulation with respect to an outer region. All of the mechanical fastenings, pipe clamps etc. are fitted within the shield.

In order to control where the electrolysis currents enter the water circuit 64 and leave the water circuit 64, electrodes 74a, 74b, 74c are arranged in the water circuit: an electrode 74a at ground potential in the connecting pipes 68a, 68b, an electrode 74b at the potential $U_1$ of the first power electronics module 50 in the first support structure 10a, and an electrode 74c at the potential $U_4$ (in general $U_n$) of the last power electronics module 50 in the last support structure 10d.

Figure 8:
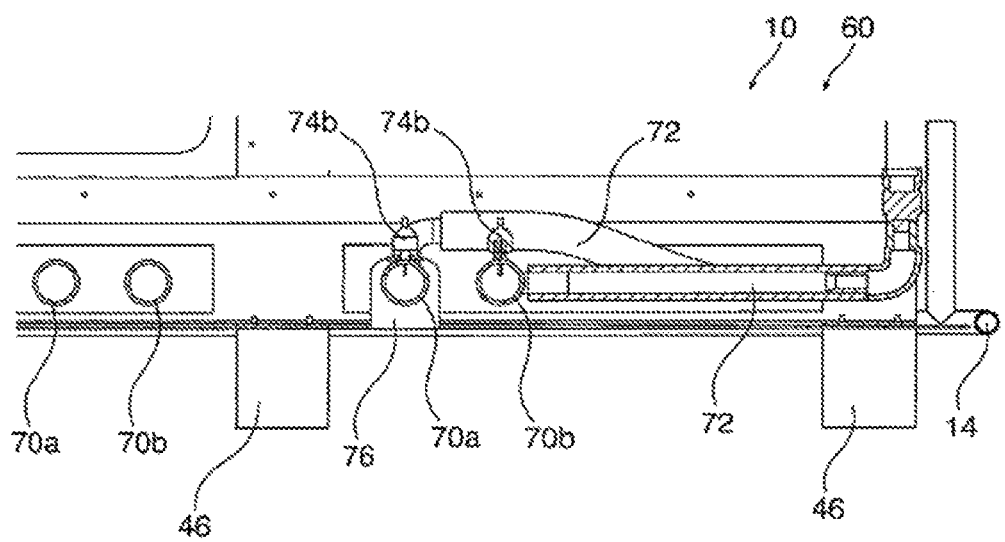
FIG. 8 shows a cross section through a detail of the support structure arrangement from FIG. 6.

FIG. 8 shows a cross section through the support structure arrangement 60. The supply and, respectively, discharge pipes 70a, 70b are fastened in the center of each support structure by a clamp 76 in which the pipe 70a, 70b in question can move in the axial direction. A thermally induced change in length of the plastic pipes 70a, 70b can be compensated for in this way.

Figure 9:
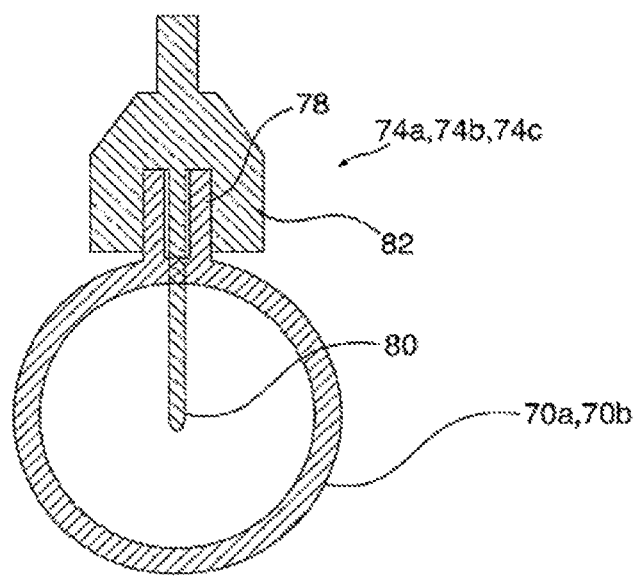
FIG. 9 shows a cross section through a coolant pipe of the support structure arrangement from FIG. 6.

FIG. 9 shows a cross section through a coolant pipe 70a, 70b of the support structure arrangement 60 in the region of an electrode 74, 74b, 74c. The coolant pipe 70a, 70b has a small attached pipe as the holder 78 for the electrode tip 80 which can be placed in the center of the coolant pipe 70a, 70b. A cover 82 of the electrode can be put or screwed over the edge of the holder 78, said cover fastening the electrode to the coolant pipe 70a, 70b and closing said coolant pipe in a leaktight manner.

FIG. 10 shows a perspective view of a further coolant circuit 64. In this case, a row 64 of support structures 10 or power electronics modules 50 is split into two groups 84a, 84b which adjoin one another but are supplied with coolant by two separate pipe systems in accordance with FIG. 7.

In this case, the second group 84b can be supplied by additional pipes 86a, 86b (an additional supply pipe 86a and an additional discharge pipe 86b) which issue into the corresponding coolant pipes of the second group 84b. In this case, the additional pipes run through the base of the support structures 10a to 10d of the first group 84a.

A flexible section (for example a rubber hose) 88 can compensate for the thermal expansion of the pipes 70a, 70b, 86a, 86b.

Like the first group 84a, the second group 84b can also be equipped with electrodes: an electrode 74a at ground potential in the connecting pipes 68a, 68b, an electrode 74b at the potential $U_5$ of the first power electronics module 50 in the first support structure 10a of the second group 84b, and an electrode 74c at the potential $U_7$ (in general $U_n$) of the last power electronics module 50 in the last support structure 10d of the second group 84b.

In addition, it should be noted that "comprising" does not exclude any other elements or steps and "a" or "an" does not exclude two or more. Furthermore, it should be noted that features or steps which have been described with reference to one of the above exemplary embodiments can also be used in combination with other features or steps of other exemplary embodiments described above. Reference symbols in the claims are not to be regarded as being restrictive.

LIST OF REFERENCE SYMBOLS

10 Support structure
14 Support frame
16 Pipes
18 Side panel
20 Pipe ring
22 Connecting pipe
24 Rounded corner
26 Rounded edge
28 Reinforcement element
30 Outer geometry
32 Rounded corner
34 Opening in side panel
36 Rounded corner
38 Holder
40 Opening in holder
42 Sliding rail
44 Lateral opening in sliding rail
46 Insulator
48 Fastening point for insulator
50 Power electronics module
52 Covering panel
54 Screw
56 Recessed fastening means
60 Support structure arrangement
62 Row of support structures
64 Coolant circuit
66a, 66b Main system pipe
68a, 68b Connecting pipe
70a, 70b Coolant pipe
72 Hose
74a, 74b, 74c Electrode
76 Terminal
78 Holder
80 Electrode tip
82 Electrode cover
84a, 84b Group of support structures
86a, 86b Additional coolant pipes
88 Elastic section

The invention claimed is:

1. A support structure arrangement for a modular converter, the support structure arrangement comprises:
a plurality of support structures each of the plurality of support structures comprises:
a holder for the insertion of at least one power electronics module;
a support frame which is composed of pipes which are connected to one another and form corners and edges of an electrically conductive outer geometry of the support structure, which outer geometry surrounds the holder,
wherein the corners and edges have a radius of curvature which is greater than a prespecified minimum radius, the prespecified minimum radius corresponding to a desired system voltage of the power electronics module, and wherein the outer geometry is designed to homogenize an electrical field strength on an outside of the support structure; and
wherein the support structures are arranged in a row;
a coolant pipe, which is composed of insulating material, for providing cooling liquid for each of the at least one power electronics modules in the plurality of the support structures;
wherein the coolant pipe is guided along the row within the outer geometries of the support structures;
at least one electrode, which is arranged in the coolant pipe, within the outer geometry of each of the plurality of the support structures which is electrically conductively connected to each of the plurality of the support structures and/or to each of the at least one power electronics modules in the plurality of the support structures in such a way that the electrode is at the potential of each of the plurality of the support structures and/or of each of the at least one power electronics modules;
wherein the electrode is arranged in a first support structure in the row, and a further electrode is arranged in the last support structure of the row.

2. The support structure arrangement as claimed in claim 1,
wherein the outer geometry of each of the plurality of the support structures is cuboidal.

3. The support structure arrangement as claimed in claim 2,
wherein each of the plurality of the support structures comprises two rectangular pipe rings with rounded corners, which pipe rings are arranged parallel in relation to one another and are connected by means of pipes which run orthogonally in relation to the pipe rings.

4. The support structure arrangement as claimed in claim 1, further comprising:
at least one side panel which provides a flat outer surface of the outer geometry of each of the plurality of the support structures.

5. The support structure arrangement as claimed in claim 4,
wherein the at least one side panel is provided between pipes of the support frame of each of the plurality of the support structures.

6. The support structure arrangement as claimed in claim 1,
wherein at least two of the power electronics modules can be inserted into the holder one behind the other.

7. The support structure arrangement as claimed in claim 1, further comprising:
at least two sliding rails which are arranged in the holder and on which the at least one power electronics module can be inserted into the holder.

8. The support structure arrangement as claimed in claim 1, further comprising:
a plurality of insulators which are fitted to the outer geometry of each of the plurality of the support structures.

9. The support structure arrangement as claimed in claim 1, wherein the coolant pipe is guided beneath rails in the support structures.

10. The support structure arrangement as claimed in claim 1, further comprising:
a connecting pipe, which is composed of an insulating material, for connecting the coolant pipe to a main system pipe;
an electrode which is arranged in the connecting pipe and is electrically connected to a ground potential of the converter.

11. The support structure arrangement as claimed in claim 1, further comprising:
a first group of support structures in the row, and a second group of support structures in the row adjoining the first group;
a further coolant pipe for the second group of support structures, which further coolant pipe is guided through the support structures of the first group.

12. The support structure arrangement as claimed in claim 2, further comprising:
at least one side panel which provides a flat outer surface of the outer geometry of each of the plurality of the support structures.

13. The support structure arrangement as claimed in claim 2,
wherein at least two of the at least one power electronics modules can be inserted into the holder one behind the other.

14. The support structure arrangement as claimed in claim 2, further comprising:
at least two sliding rails which are arranged in the holder and on which at least one power electronics module can be inserted into the holder.

* * * * *